United States Patent [19]

Fletcher et al.

[11] 4,061,974

[45] Dec. 6, 1977

[54] ULTRA STABLE FREQUENCY DISTRIBUTION SYSTEM

[76] Inventors: James C. Fletcher, Administrator of the National Aeronautics and Space Administration, with respect to an invention of; Richard L. Sydnor, Altadena; John W. MacConnell, La Canada, both of Calif.

[21] Appl. No.: 699,002

[22] Filed: June 21, 1976

[51] Int. Cl.² .......................................... H04B 1/50
[52] U.S. Cl. ................................ 325/58; 178/69.1; 325/63; 343/179
[58] Field of Search ................... 325/4, 5, 17, 58, 63; 343/177–180; 178/69.1; 179/15 BS

[56] References Cited

U.S. PATENT DOCUMENTS

| | | | |
|---|---|---|---|
| 2,521,721 | 9/1950 | Hoffman et al. | 325/58 |
| 2,869,121 | 1/1959 | Minneman et al. | 324/4 |
| 2,958,768 | 11/1960 | Brauer | 325/17 |
| 3,230,453 | 1/1966 | Boor et al. | 325/17 |
| 3,424,864 | 1/1969 | Williams | 325/58 |
| 3,430,237 | 2/1969 | Allen | 325/4 |
| 3,550,134 | 12/1970 | Kurth et al. | 325/58 |
| 3,646,444 | 2/1972 | Bitzer | 325/58 |
| 3,651,408 | 3/1972 | Miller | 325/58 |
| 3,858,007 | 12/1974 | Ganssmantel | 325/4 |

*Primary Examiner*—Robert L. Griffin
*Assistant Examiner*—Marc E. Bookbinder
*Attorney, Agent, or Firm*—Monte F. Mott; Paul F. McCaul; John R. Manning

[57] ABSTRACT

A system for synchronizing a signal at a remotely located slave station with the phase and frequency of a signal generated at a master station. The signal transmitted at the master station and received by the slave station provides compensation for the phase shift caused by the transmission path delays between the master and slave station. The slave station transmits a signal to the master station at a frequency that is different from the frequency of the signal being transmitted by the master station. The signal transmitted by the slave station is received by the master station while the master station transmitter is off. The signal transmitted by the master station is received by the slave station while the slave station transmitter is off.

9 Claims, 5 Drawing Figures

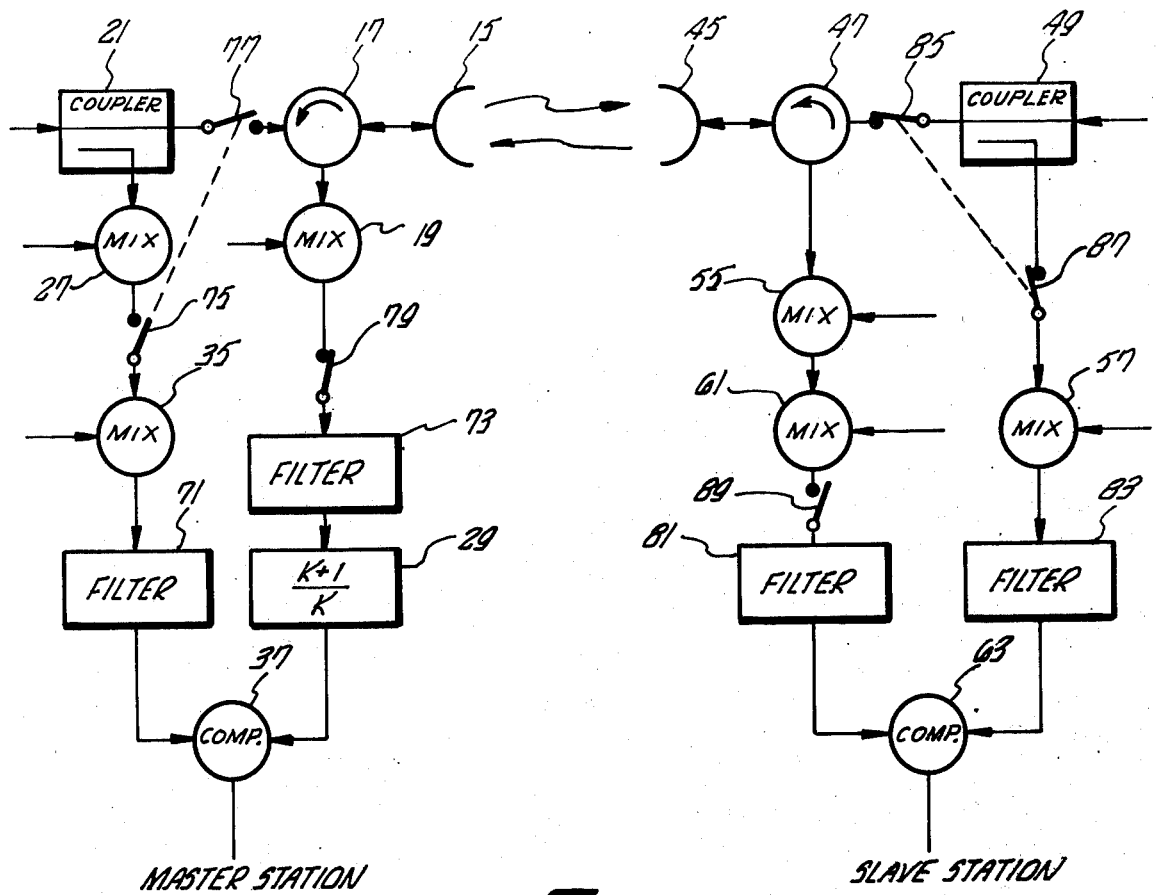
FIG_2
MASTER STATION
SLAVE STATION
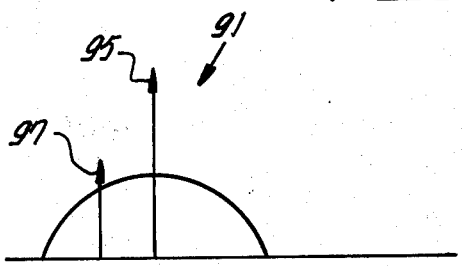
FIG_3
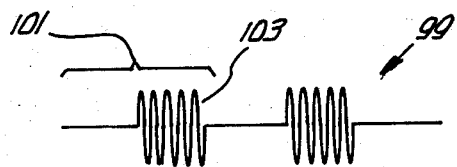
FIG_4
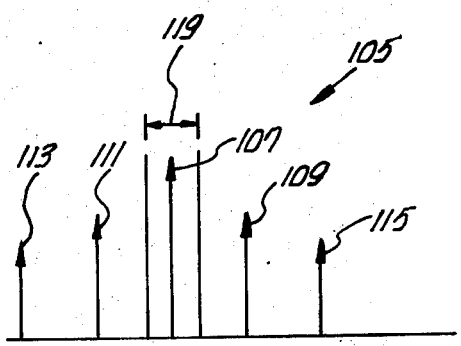
FIG_5

ULTRA STABLE FREQUENCY DISTRIBUTION SYSTEM

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

BACKGROUND OF THE INVENTION

The present invention relates to a distribution system for a frequency standard, and more particularly pertains to a method and apparatus for distributing a reference signal that has a standard frequency and phase over RF links; said system adaptively correcting for any phase perturbation introduced into the link.

There are many applications in existence which require the phase synchronization of two signals respectfully generated at a first and second station where the stations are remotely located from each other. Thus, for example, a reference signal from a hydrogen maser frequency standard may need to be produced in phase synchronization at a multiplicity of sites. In order to avoid the high cost of separate hydrogen maser frequency standards, at each site and eliminate the skew which is inherent in systems using separate frequency standards, a system for phase synchronizing a reference signal with a second slave signal is needed.

Prior art systems of this type are known. These systems employ a closed loop signal path in which a reference signal is transmitted from a first to a second remote station. The remote station then retransmits the received signal back to the first station. The received retransmitted signal from the remote station is mixed with a reference signal at that first station to form phase information which is used on the signal transmitted from the first station to compensate for the phase distortion caused by transmission path delays.

A major problem exhibited by these systems is the interference between the receiver and transmitter at each of the stations. Each station, master station or slave station, has both a receiver and transmitter. The present invention alleviates this interference problem by both reducing the noise coupling between the transmitter and receiver at any one station and by providing each station with the ability to distinguish between a transmitted and a received signal. In addition, the present invention is not affected by movement causing a change in the distance between the master and slave station, as is the case for prior art systems.

SUMMARY OF THE INVENTION

Distribution of a standard frequency signal from a reference source such as a hydrogen maser over radio links is accomplished by a system and method that provides no signal degradation at the remote sites. A voltage controlled oscillator at the master station is phase-locked to phase differences that occur between the signal transmitted from the master station and a signal received from a slave station. This phase difference is determined by use of a reference signal having a standard frequency and phase that is to be reproduced at all remote sites. The frequency of the signal transmitted from the master station is different from this standard signal, as is the frequency of the signal transmitted from a slave station. The slave station generates a signal having the standard frequency and phase of the reference signal input to the master station by driving a voltage controlled oscillator according to the phase difference between the signal transmitted by the slave station and the signal received by it.

In order to reduce transmitter interference with the received signal, both at the master and slave station, the transmitter and receiver at the master station is turned on and off in synchronism with the transmitter and receiver at a slave station. Consequently, when the master station is transmitting, it is not receiving.

BRIEF DESCRIPTION OF THE DRAWINGS

Many of the advantages and objects of this invention will be readily appreciated as the same becomes better understood by reference to the following detailed description when considered in conjunction with the accompanying drawings in which like reference numerals designate like parts throughout the figures thereof and wherein;

FIG. 2 is a block diagram of a portion of the frequency distribution system of FIG. 1 modified as shown to provide an alternate embodiment of the present invention;

FIG. 3 is a graph spectrum plot;

FIG. 4 is a graph time domain plot; and

FIG. 5 is a graph frequency plot.

DESCRIPTION OF THE PREFERRED EMBODIMENT

Figure 1:
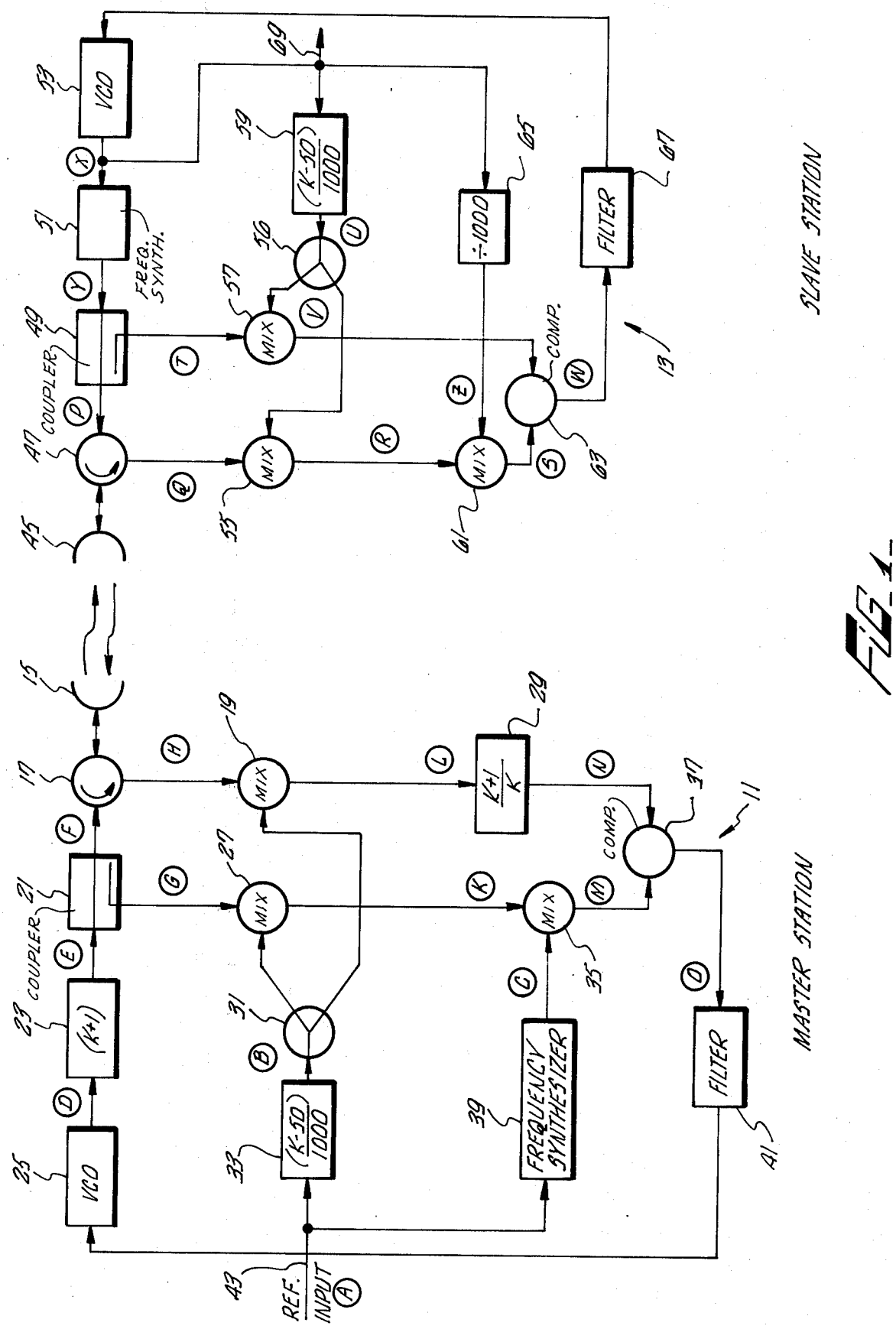
FIG. 1 is a block diagram illustration of a frequency distribution system according to the present invention.

The frequency distribution system illustrated in FIG. 1 as comprising a master station 11 and a slave station 13, utilizes a transmitter and receiver at each station although not specifically shown as such.

Referring first to the master station 11, the transmitter section is made up essentially of a voltage controlled oscillator 25 driving a synthesizer circuit 23 which is connected to a directional coupler 21. The coupler 21 is connected to circulator 17 and antenna 15. The receiver section is essentially made up of antenna 15 connected to circulator 17 which is in turn connected to mixer 19. Mixer 19 is connected to synthesizing circuit 29. The phase compensation circuitry of the station includes synthesizer circuit 33, synthesizer circuit 39, mixers 27 and 35, signal router 31, comparator 37 and filter 41.

The slave station 13 is very similar in structure to the master station 11. The transmitter section of the slave station has a voltage controlled oscillator 53 driving a frequency synthesizer 51 which in turn is connected to a directional coupler 49. Coupler 49 feeds a circulator 47 which in turn is connected to an antenna 45. The receiver section includes the antenna 45, connected to circulator 47 which is in turn connected to mixer 55. Mixer 55 is connected to mixer 61.

The phase compensation circuit at the slave station comprises a frequency synthesizer 59, splitter circuit 56, mixer 57, synthesizer 65, comparator 63 and filter 67.

The purpose of the master station 11 working in combination with slave station 13 is to take a reference input signal at input line 43 of the master station and produce the same frequency and phase reference signal at output 69 of the slave station 13, wherein the only link between the master and slave stations is the R.F. link made up of antennas 15 and 45. How this is accomplished will not be described. The letters within circles placed at certain points throughout the master station and the slave station correspond to the letters of the following table which indicates in mathematical form the signals that are present in the master and slave stations, at those points.

TABLE
MASTER STATION

A. $1000\,\omega_R \angle 0$

B. $(K - 50)\,\omega_R \angle 0$

C. $101\,\omega_R \angle 0$

D. $\omega_R \angle \dfrac{\phi}{K+1}$

E. $(K + 1)\,\omega_R \angle \phi$

F. $(K + 1)\,\omega_R \angle \phi$

G. $(K + 1)\,\omega_R \angle \phi$

H. $K\omega_R \angle K\theta - K\omega_R\tau$

K. $51\,\omega_R \angle \phi$

L. $50\,\omega_R \angle \dfrac{K\phi}{K+1} - 2K\omega_R\tau$

M. $50\,\omega_R \angle -\phi$

N. $50\,\omega_R \angle \phi - 2(K+1)\,\omega_R\tau$

O. $\phi = (K+1)\,\omega_R\tau$

TABLE
SLAVE STATION

P. $K\omega_R \angle K\theta$

Q. $(K + 1)\,\omega_R \angle \phi - (K+1)\,\omega_R\tau$

R. $51\,\omega_R \angle \phi - (K+1)\,\omega_R\tau - (K-50)\,\theta$

S. $50\,\omega_R \angle \phi - (K+1)\,\omega_R\tau - K\theta + 49\theta$

T. $K\omega_R \angle K\theta$

U. $(K - 50)\,\omega_R \angle (K-50)\,\theta$

V. $50\,\omega_R \angle 50\,\theta$

W. $\theta = -\omega_R\tau + \dfrac{\phi}{K+1}$

X. $1000\,\omega_R \angle 1000\,\theta$

Y. $K\omega_R \angle K\theta$

Z. $\omega_R \angle \theta$

1. $\omega_R$ is the frequency of the signal generated by the VCO at master station 11.

2. $K$ is a constant.

3. $\phi$ and $\theta$ are phase angles and

4. $\tau$ is the phase delay perturbation introduced by the R.F. line 15-45.

The signal A introduced at 43 from a standard frequency reference such as a hydrogen maser is shown to be: $1000\omega_R \angle 0$. This will be subsequently shown to be the output of the oscillator 53 at the slave station 13. Signal X the output of VCO 53, is $1000\omega_R \angle 1000\,\theta$. If the correcting circuitry of the master station 11 and slave station 13 are working, the angle theta will be zero, thereby providing a reference signal at line 69 which is identical in frequency and phase to the reference signal which is the standard on line 43 at the master station 11.

The voltage control oscillator 25 at the master station 11 is driven at a frequency of $\omega_R \angle(\phi/K+1)$. This output signal D of the oscillator 25 is operated on by synthesizer circuit 23 which multiplies signal D by the constant $K+1$ providing the signal E, which is $(K+1)\,\omega_R \angle \phi$. Signal E is the same as signal F. Signal F is transmitted to the slave station 13 by way of directional coupler 21, circulator 17 and antenna 15. Directional coupler 21 couples a portion of the signal E, as signal G, and supplies it to a mixer 27. As the result of signal F being transmitted to the slave station 13, a signal Q which exhibits a phase perturbation of $(K+1)\,\omega_R\tau$ is received. Signal Q is of the form $$(K+1)\,\omega_R \angle \phi - (K+1)\omega_R\tau.$$

The reference signal at the slave station 13 is generated by VCO 53 which has an output signal X $1000\omega_R \angle 1000\theta$. As will be shown later, if $\theta$ is equal to zero, then the output signal on line 69 at the slave station 13 is equal to $1000\omega_R \angle 0$ which is equal to the reference input signal A at the master station 11.

The reference signal X generated by the VCO 53 whether the angle is zero or not, is utilized by the slave station 13 in the following manner. Frequency synthesizer circuit 59 takes signal X and multiplies it by $(K-50)/1000$ producing signal U which is $(K-50)\omega_R \angle(K-50)\theta$. Frequency synthesizer circuit 65 divides signal X by 1000 producing the signal Z $\omega_R \angle \theta$. The signal U is routed by router 56 to mixer 57 and mixer 55. The output of synthesizing circuit 65 is supplied to mixer 61.

Mixer 55 subtracts the signal U from the signal Q, thereby producing a signal R:

$$Q - U = R$$

$$[(K+1)\omega_R \angle \phi - (K+1)\omega_R\tau] - [(K-50)\omega_R \angle (K-50)\theta]$$

$$51\omega_R \angle \phi - (K+1)\omega_R\tau - (K-50)\theta = R$$

Signal R is supplied to mixer 61. Signal Z from the frequency synthesizer 65 is also supplied to mixer 61. Mixer 61 provides signal S as follows:

$$R - Z = S$$

$$51\omega_R \angle \phi - (K+1)\omega_R\tau - (K-50)\theta - \omega_R \angle \theta$$

$$50\,\omega_R \angle \phi - (K+1)\omega_R\tau - K\theta + 49\theta = S$$

The output of VCO 53, signal X, is supplied to a frequency synthesizer 51 which multiplies this signal by $(K)/1000$ to provide a signal $YK\omega_R \angle K\theta$. The directional coupler 49 takes a portion of signal Y and supplies it as signal P to mixer 57. The remaining portion of that signal, as signal P is supplied through circulator 47 to antenna 45 to be transmitted back to the master station 11. The mixer 57, therefore, receives signals $T$ and $U$ and produces a signal $V$ at its output as follows:

$$T - U = V$$

$$K\omega_R \angle K\theta - [(K-50)\omega_R \angle (K-50)\theta]$$

$$50\omega_R \angle K\theta - K\theta + 50\theta$$

$$50\omega_R \angle 50\theta = V$$

The comparator 63 receives the signal $S$ and the signal $V$. *The output of the comparator 63 is a signal W which is an indication of the phase difference between signal S and the signal V.* This is obtained as follows:

$$S = V$$

$$50\omega_R \angle \phi - (K+1)\omega_R\tau - K\theta + 49\theta = 50\omega_R \angle 50\theta$$

$$50\theta = -(K+1)\omega_R\tau + \phi - K\theta + 49\theta$$

$$(K+1)\theta = -(K+1)\omega_R\tau + \phi$$

$$\theta = -\omega_R\tau + (\phi/K+1)$$

The phase difference signal $W$ at the output of comparator 63 is forced to be zero by the phase-lock loop. This signal is supplied to filter 67. Tracking filter 67 performs the function of determining the bandwidth of the slave station phase-lock loop. The output of filter 67 drives the VCO 53 to correct the phase of the signal $X$ of VCO 53 thereby forcing $S = V$ and therefore causing $W = 0$.

The signal $P$ transmitted by the slave station 13 is received at master station 11 by antenna 15. The received signal $H$ exhibits a phase perturbation equal to $K\omega_R\tau$. The signal $H$ at the output of the circulator 17 takes the following form:

$$K\omega_R \angle K\theta - K\omega_R\tau$$

We can reduce this expression down to a $\phi$ phase angle by making a substitution for $\theta$ which was shown over at the slave station to be the signal $(\phi/K+1) = \omega_R\tau$. Therefore, for the signal $H$ in terms of $\phi$ we have:

$$K\omega_R \angle K\theta - K\omega_R\tau = H$$

$$K\omega_R K(-\omega_R\tau + (\phi/K+1)) - K\omega_R\tau = H$$

$$K\omega_R \angle (K\phi/K+1) - 2 K\omega_R\tau = H$$

The signal $H$ is supplied to mixer 19 and is mixed with the signal $B$ which is the output of frequency synthesizer 33. The mixer 19 provides the signal $L$ as follows:

$$L = H - B = K\omega_R \angle (K\phi/K+1) - 2 K\omega_R\tau$$
$$- (K-50)\omega_R 0 = 50\omega_R \angle (K\phi/K+1) - 2 K\omega_R\tau$$

The signal $L$ is then operated on by the synthesizer circuit 29 which multiples the signal $L$ by $(K+1)/K$ to provide the signal $N$ as follows:

$$N = \frac{(K+1)}{K} 50\omega_R \left\lfloor \frac{K\phi}{K+1} - 2K\omega_R\tau \right.$$

$$= 50\omega_R \left\lfloor \frac{(K+1)}{K} \frac{K\phi}{K+1} - \frac{(K+1)}{K} 2K\omega_R\tau \right.$$

-continued $$= 50\omega_R \lfloor \phi - 2(K+1)\omega_R\tau$$

It should be remembered that the frequency synthesizer 29 operates only on the phase of the signal $L$ and not on the frequency. This signal $N$ is supplied to the comparator 37.

The other input to comparator 37 is the signal $M$ which is produced at follows. The output signal $D$ of the VCO 25 is operated on by frequency synthesizer circuit 23 which multiplies that signal by $K+1$ to produce signal $E$. This signal is transmitted to the slave station as signal $F$. But a portion of that signal, signal $G$ is taken by directional coupler 21 and supplied to mixer 27.

Mixer 27 takes signal $G$ and the signal $B$ which is the output of synthesizer 33, directed by router 31 to mixer 27, and produces signal $K$ as follows:

$$K = G - B = (K+1)\omega_R \angle \phi - [(K-50)\omega_R \angle 0] = 51$$
$$\omega_R \angle \phi$$

The reference input signal $A$ on line 43 is supplied to frequency synthesizer circuit 39 which multiplies the reference signal $A$ by 101/1,000 thereby generating a signal $C$ $101\omega_R \angle 0$. Signal $C$ is the other input to mixer 35. Mixer 35 takes signal $K$ and signal $C$ and produces signal $M$ as follows:

$$M = C - K = 101\omega_R \angle 0 - 51\omega_R \phi = 50\omega_R \angle -\phi$$

Comparator 37 takes signals $M$ and $N$ and produces a signal $R$ which is the phase difference between $M$ and $N$, as follows:

$$M = N$$

$$50\omega_R \angle -\phi = 50\omega_R \angle \phi - 2(K+1)\omega_R\tau$$

$$-\phi = -2(K+1) \omega_R\tau + \phi$$

$$-2\phi = -2(K+1) \omega_R\tau$$

$$\phi = (K+1)\omega_R\tau$$

The signal $O$ (phase angle $\phi$) is supplied to tracking filter 41 which performs the function of determining the bandwith of the master station phase-lock loop. The output of filter 41 is supplied to the VCO 45 to force the signals M and N to have the same frequency and phase.

As was described earlier for the slave station 13, in order for perfect correction to occur, the angle $\theta$ must be zero. The phase signal $\theta$ generated at the slave station was shown to be: $-\omega_R\tau + (\phi/K+1)$. Substituting for the angle $\phi$ in this relationship, we have:

$$\theta = -\omega_R\tau + \frac{\phi}{K+1}$$

$$= -\omega_R\tau + \frac{(K+1) \omega_R\tau}{K+1} = 0$$

Thus, it can be seen that the angle $\theta$ actually is zero and the output of the VCO 53 signal $X$ at the slave station becomes 1,000 $\omega_R \angle 0$. This is equal to the reference signal A provided to the master station 11 at line 43.

An alternate preferred embodiment of the present invention which provides adequate phase stability between the master and slave stations although not 100% correction, is a system as described in FIG. 1 with the synthesizer circuit 29 eliminated so that the output of mixer 19 is fed directly to comparator 37. With the synthesizer 29 eliminated, the operation at comparator 37 to generate signal R is performed as follows:

$$M = L$$

$$50\omega_R \lfloor -\phi = 50\omega_R \lfloor \frac{K\phi}{K+1} - 2K\omega_R T$$

$$-\phi = \frac{K\phi}{K+1} - 2K\omega_R T$$

$$-\phi(1 + \frac{K}{K+1}) = -2K\omega_R T$$

$$\phi(2\frac{K+1}{K+1}) = 2K\omega_R T$$

$$\phi = (\frac{2K}{2K+1})(K+1)\omega_R T$$

As can be seen $\phi$ has the additional factor of $(2K/2K+1)$. The phase error between the master station and slave station will be represented by this factor $(2K/2K+1)$. However, if K is very large $(2K/2K+1)$ closely approaches unity and the error becomes very small.

This type of system may be quite satisfactory for many applications. The simplicity achieved by eliminating the $(K+1/K)$ synthesizer, in most cases far outweighs the small error introduced as a result of its elimination.

In order to circumvent the problem of broad band noise from the transmitter at the master and slave stations getting into their respective receivers, it is preferred that the system of FIG. 1 is modified as shown in FIG. 2. FIG. 2 is only a partial illustration of the entire system, illustrating only those parts thereof that have been changed. FIG. 3 illustrates the problem presented at each of the master and slave stations. The plot 91 of transmitter signal 95 and receiver signal 97 is a plot of amplitude versus frequency and illustrates the broad band noise 93 present at the output of the transmitter. As can be seen, the received signal 97 is almost completely buried in the broad band noise 93. In order to prevent this broad band noise 93 from entering the receiver at the respective master and slave stations, the transmitter at each of the stations is shut off while that station is receiving, and the receiver at each station is shut off while that station is transmitting.

This is accomplished by a plurality of switches. Looking first at master station 11, we have a pair of switches 75 and 77 located as shown in the transmitter section which are coupled together to open and close at the same time. In addition, a switch 79 is located in the receiver leg of master station 11. When the master station is transmitting the switch 79 in the receiving leg is opened and the switches 77 and 75 are closed. Whenever master station 11 is receiving, switch 79 is closed and switches 77 and 75 are open. As shown, master station 11 is in a receiving mode.

Like the master station 11, slave station 13 has a pair of switches 85 and 87 in the transmitter section that are closed when that station is transmitting. In addition, switch 89 in the receiving leg of slave station 13 is opened when that station is transmitting. When slave station 13 is receiving, switch 89 is closed and switches 85 and 87 are both opened. As shown, slave station 13 is in a transmitting mode.

The transmit switches 75 and 77 of the master station are synchronized with the transmit switches of slave station 13. In short transmission paths where the propagation is quite small, the transmit switches 75 and 77 of master station 11 are opened when transmit switches 85 and 87 of slave station 13 are closed. Likewise, whenever receive switch 79 of master station 11 is closed receive switch 89 of slave station 13 is opened. However, for long transmission paths where the propagation time is larger, transmit switches 75 and 77 of master station 11 may be closed at the same time that transmit switches 85 and 87 of slave station 13 are closed. Although master and slave station may overlap in their transmit cycle, because of the relatively longer propagation time, the transmit switches are opened at the instant the receive leg switch is closed in anticipation of a received signal.

Because the transmitter and receiver section of each of the stations is continually being switched on and off, the received or transmitted signal 99 at each of the stations will appear as shown in FIG. 4 which is a time domain plot of the signals. The switching is accomplished so that an approximately 50% duty cycle is seen by the transmitter and receiver. That is, the on-off time 101 is split 50-50 so that the received signal 103 is received in bursts as shown.

Because the transmitter and receiver are being switched on and off, a plurality of side bands are generated along with the main signal 107. Thus, as can be seen in the spectrum plot 105 of FIG. 5 the broad band noise and transmitter signals have been eliminated from the receiver. However, side bands 111, 113, 109 and 115 are generated by the aforementioned switching.

In order to make the system respond as if continuous signals were being used, a band pass filter, having a width 119 is inserted in the receive and transmit legs at each station. Thus, filters 73 and 71 at the master station 11 and filters 81 and 83 at the slave station 13 make is appear as if continuous signals are being transmitted and received. The filters do this by blocking all the side bands. Filter 73 in the receiving leg of master station 11 would be centered around the I.F. frequency of the receiving signal (point N in FIG. 1). Filter 71 in the transmit leg of the master station 11 would be centered around the transmit I.F. frequency (Point M in FIG. 1). The same would be true with filters 81 and 83 in the slave station 13.

What has been described is an ultra stable frequency distribution system utilizing radio frequency links between a master reference frequency source and remote located stations. Obviously, many modifications and variations of the present invention are possible. In light of the above teachings, it is therefore to be understood that within the scope of the appending claims, the invention may be practiced otherwise than as specifically described.

What is claimed is:

1. A system for distributing a reference signal to remote locations by radio frequency transmission, said system comprising:
    a master station having a transmitting and receiving means, said master station including:
    a variable phase oscillator means generating a signal for application to said transmitting means, said signal having a certain frequency and a phase related to its input signal;
    means for receiving a reference signal having a standard frequency and phase;

means for mixing the reference signal with a transmitted signal and a received signal, respectively; and comparison means for generating a signal representing the phase difference between the transmitted signal and the received signal from said mixing means, said phase difference signal being supplied to said oscillator as its input signal; and a slave station having a transmitting and receiving means, said slave station including:

a variable phase oscillator means generating a signal for application to said transmitting means, said signal having a certain frequency and a phase related to its input signal, the generated signal having a frequency and phase substantially equal to the frequency and phase of the reference signal received at said master station; and comparison means responsive to transmitted signal and a received signal for generating a signal representing the phase difference between said transmitted signal and said received signal, said phase difference signal being supplied to said oscillator as its input signal.

2. The system of claim 1 wherein the frequency of the signal transmitted by said master station is different from the frequency of the signal transmitted by said slave station.

3. The system of claim 1, further comprising:

said master station including means for alternately turning said master station transmitter and receiver on and off, said master receiver being off when said master station transmitter is on; and said slave station including means for alternately turning said slave station transmitter and receiver on and off in synchronism with the master station transmitter and receiver.

4. The system of claim 3 wherein the frequency of the signal transmitted by said master station is different from the frequency of the signal transmitted by said slave station.

5. The system of claim 1 wherein said master station further includes:

means for multiplying the output frequency and phase of said master station oscillator by a first constant, the product signal being transmitted to said slave station; and said slave station further includes means for multiplying the output frequency and phase of said slave station oscillator by a second constant, the product signal being transmitted to said master station.

6. The system of claim 1 wherein said master station further includes:

means for multiplying the frequency and phase of said reference signal by a constant to produce a product signal; and means for mixing the product signal with the transmitted signal and the received signal, respectively.

7. The system of claim 6 wherein the outputs of said mixing means are supplied to said comparison means.

8. The system of claim 1 wherein said slave station further comprises:

means for multiplying the frequency and phase of said signal from said oscillator by a constant to produce a product signal and means for mixing the product signal with the transmitted signal and the received signal, respectively.

9. The system of claim 8 wherein the outputs of said mixing means are supplied to said comparison means.

* * * * *